United States Patent
Chen et al.

(10) Patent No.: US 10,249,587 B1
(45) Date of Patent: Apr. 2, 2019

(54) SEMICONDUCTOR DEVICE INCLUDING OPTIONAL PAD INTERCONNECT

(71) Applicant: WESTERN DIGITAL TECHNOLOGIES, INC., San Jose, CA (US)

(72) Inventors: Han-Shiao Chen, Taichung (TW); Chih-Chin Liao, Changhua (TW)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/843,951

(22) Filed: Dec. 15, 2017

(51) Int. Cl.
  *H01L 23/52* (2006.01)
  *H01L 23/00* (2006.01)
  *H01L 25/065* (2006.01)

(52) U.S. Cl.
  CPC .......... *H01L 24/06* (2013.01); *H01L 24/03* (2013.01); *H01L 24/11* (2013.01); *H01L 24/48* (2013.01); *H01L 24/85* (2013.01); *H01L 25/0657* (2013.01); *H01L 2224/02375* (2013.01); *H01L 2224/0401* (2013.01); *H01L 2224/04042* (2013.01); *H01L 2224/05553* (2013.01); *H01L 2224/05578* (2013.01); *H01L 2224/0612* (2013.01); *H01L 2224/48091* (2013.01); *H01L 2224/48106* (2013.01); *H01L 2224/48147* (2013.01); *H01L 2224/48227* (2013.01); *H01L 2224/48465* (2013.01); *H01L 2225/0651* (2013.01); *H01L 2225/06506* (2013.01); *H01L 2225/06562* (2013.01)

(58) Field of Classification Search
  CPC ..... H01L 24/48; H01L 25/0657; H01L 24/11; H01L 24/03; H01L 24/06; H01L 24/85
  USPC .......................................................... 257/738
  See application file for complete search history.

(56) References Cited

U.S. PATENT DOCUMENTS

| | | | | |
|---|---|---|---|---|
| 5,308,928 A | * | 5/1994 | Parla | B23K 37/06 174/250 |
| 6,991,970 B2 | * | 1/2006 | Fogal | G11C 17/16 257/E21.595 |
| 7,132,738 B2 | | 11/2006 | Tomimatsu | |
| 7,541,680 B2 | * | 6/2009 | Kwon | H01L 23/50 257/685 |
| 8,368,197 B2 | * | 2/2013 | Kook | H01L 23/49575 257/686 |
| 9,129,846 B2 | * | 9/2015 | Song | H01L 25/105 |
| 9,478,487 B2 | * | 10/2016 | Yang | H01L 23/49838 |
| 9,613,914 B2 | * | 4/2017 | Chen | H01L 23/3114 |
| 2013/0093080 A1 | | 4/2013 | Han et al. | |

* cited by examiner

*Primary Examiner* — Luan C Thai
(74) *Attorney, Agent, or Firm* — Vierra Magen Marcus LLP

(57) ABSTRACT

A semiconductor device is disclosed including semiconductor die formed with functionally redundant main and optional die bond pads. In examples, the optional die bond pad is configured to be optionally redundant to the main die bond pad by forming the optional die bond pad with first and second electrically isolated portions, and electrically interconnecting the main die bond pad with the first portion of the second die bond pad. The second die bond pad may or may not be made redundant to the first die bond pad depending on whether an electrically conductive material is deposited on the first and second portions of the optional die bond pad.

29 Claims, 7 Drawing Sheets

SEMICONDUCTOR DEVICE INCLUDING OPTIONAL PAD INTERCONNECT

BACKGROUND

The strong growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

Semiconductor memory may be provided within a semiconductor package, which protects the semiconductor memory and enables communication between the memory and a host device. Examples of semiconductor packages include system-in-a-package (SiP) or multichip modules (MCM), where a plurality of die are mounted and interconnected on a small footprint substrate. A number of semiconductor die may be mounted in an offset stack so that the die bond pads on each die are left exposed at an edge of the die. The die bond pads of the respective die in the stack may then typically be wire bonded to each other and the substrate to allow signal exchange to/from select die in the die stack.

It is often desirable to make one or more of the die bond pads on a die redundant. For example, the die bond pads used for the chip-enable signal may have a main die bond pad and redundant, or optional, die bond pad that are electrically connected to the same contact pad on the substrate.

There are two traditional methods for wire bonding to a main and optional die bond pad. The first is a so-called "Y"-shape wire bond. Using a simple example of a first die D1 mounted on a substrate and a second die D2 mounted on die D1, it may be desirable to make first and second redundant die bond pads on the second die D2. A wire bond may be formed from the substrate to a first die bond pad on the D1, and a second wire bond is formed straight up from the first die bond pad on D1 to a first die bond pad on D2. Then, to form the redundant "Y"-shape bond, a third wire bond is also formed diagonally from the first die bond pad on D1 to a second die bond pad on D2 (thus forming a "Y"-shaped bond involving the first die bond pad on D1 and the first and second die bond pads on D2). This traditional bonding method is problematic in that three wire bonds are formed on the first die bond pad on D1 (one from the substrate and two to die D2). Three bonds on the same bond pad presents a reliability risk such as electrical shorting or failure (where a bond may separate from the pad).

A second traditional method for redundant wire bonding is to form the redundant wire bond to die D2 directly from the substrate. A wire bond may be formed from a first contact pad on the substrate to a first die bond pad on the D1, and second wire bond is formed straight up from the first die bond pad on D1 to a first die bond pad on D2. Then, to form the redundant wire bond, a third wire bond is formed diagonally from the first contact pad on the substrate to a second die bond pad on D2 (passing over die D1). In this simple example, the third wire bond goes from the substrate to the second die but semiconductor devices would more commonly have larger numbers of die (4, 8, 16 or even 32 die). Forming a wire bond directly from the substrate to an upper level die results in a long wire bond presenting a reliability risk such as shorting against other wire bonds or collapse of the long wire bond.

DETAILED DESCRIPTION

The present technology will now be described with reference to the figures, which in embodiments, relate to a semiconductor device including semiconductor die formed with functionally redundant main and optional die bond pads. In embodiments, the optional die bond pad on a semiconductor die may be formed with a first portion that is electrically connected to the integrated circuits within the semiconductor die. The optional die bond pad may further be formed with a second portion, surrounding but electrically isolated from, the first portion. A conductive metal interconnect may be formed on the semiconductor die extending between and electrically coupling the second portion of the optional die bond pad with the main die bond pad.

When it is desired to use the main and optional die bond pads as redundant die bond pads, the first and second portions of the optional die bond pad may be electrically coupled to each other, such as for example by a ball bump formed on the optional die bond pad over both the first and second portions of the optional die bond pad. When it is desired to leave the main and optional die bond pads electrically unconnected, the ball bump may be omitted from the optional die bond pad.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the technology inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25% of a defined dimension.

Figure 1:
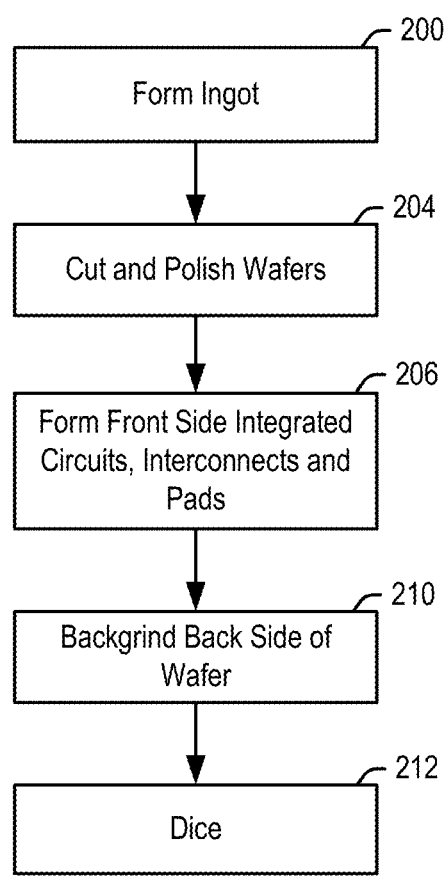
FIG. 1 is a flowchart for forming a semiconductor die according to embodiments of the present technology.

An embodiment of the present technology will now be explained with reference to the flowcharts of FIGS. 1 and 6, and the views of FIGS. 2-5 and 7-12. Referring initially to the flowchart of FIG. 1, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

In step 204, the semiconductor wafer 100 may be cut from an ingot and polished on both the first major surface 102 (FIG. 2), and second major surface opposite surface 102, to provide smooth surfaces. In step 206, the first major surface 102 may undergo various processing steps to divide the wafer 100 into respective semiconductor die 106 (FIGS. 2 and 3), and to form integrated circuits of the respective semiconductor die 106 on and/or in the first major surface 102. These various processing steps may include metallization steps depositing metal interconnect layers and vias within the wafer. These metal interconnect layers and vias may be provided for transferring signals to and from the integrated circuits within each semiconductor die, and to provide structural support to the integrated circuits.

Figure 2:
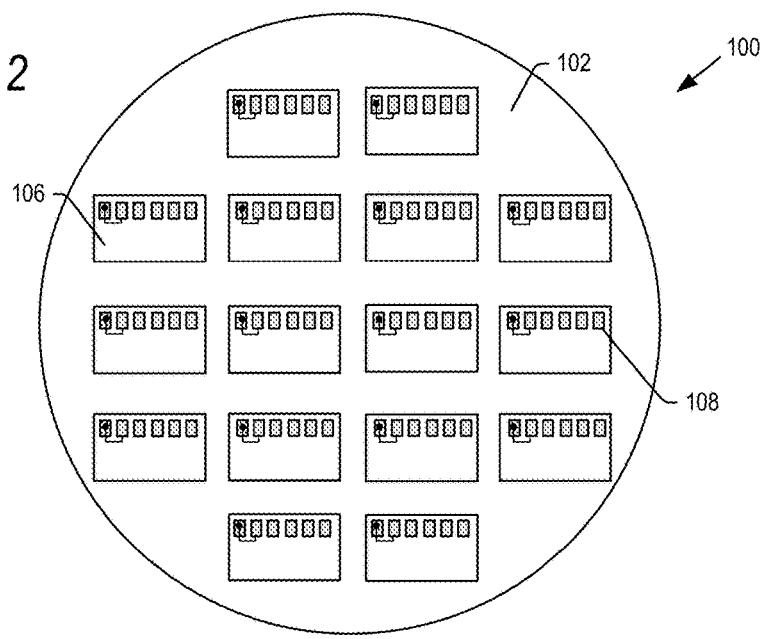
FIG. 2 is a front view of a semiconductor wafer showing a first major surface of the wafer.

In embodiments, the integrated circuits may operate as NAND flash memory semiconductor die, though other types of integrated circuits are contemplated. The number of semiconductor die 106 shown on wafer 100 in FIG. 2 is for illustrative purposes, and wafer 100 may include more semiconductor die 106 than are shown in further embodiments.

Figure 3:
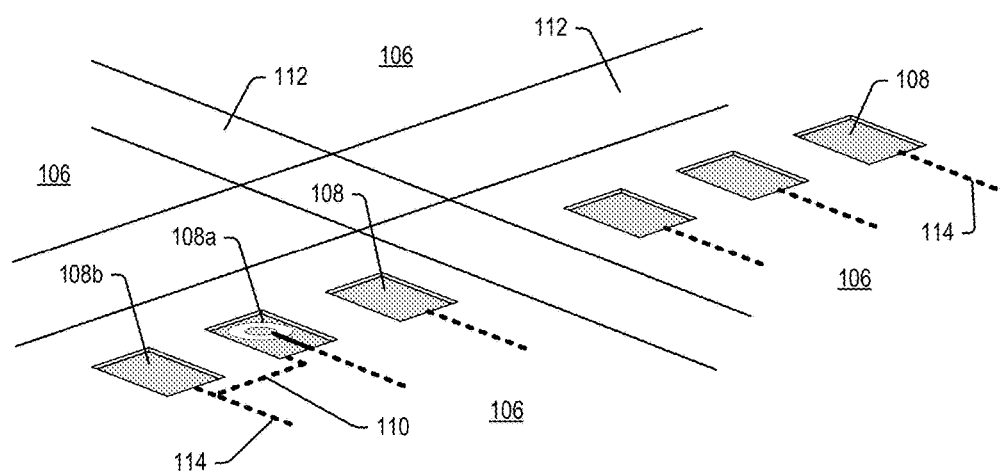
FIG. 3 is an enlarged view of a portion of the wafer showing die bond pads formed on a portion of the wafer.

The metallization step 206 may further include depositing metal contacts including die bond pads 108 exposed on the first major surface 102. The number of bond pads 108 on each semiconductor die 106 is shown for illustrative purposes, and each die 106 may include more die bond pads than are shown in further embodiments. Each die bond pad 108 may include an upper, contact layer formed over a liner. As is known in the art, the contact layer may be formed for example of copper, aluminum and alloys thereof, and the liner may be formed for example of a titanium/titanium nitride stack such as for example Ti/TiN/Ti, though these materials may vary in further embodiments. The bond pads 108 (contact layer plus liner) may have a thickness of 720 nm, though this thickness may be larger or smaller in further embodiments. In embodiments, each die bond pad 108 may have a length and width of 50 μm to 70 μm, though the length and width of pads 108 may vary in further embodiments, proportionately or disproportionately to each other. Additionally, while shown as rectangle or square, the die bond pads may be a variety of other shapes, including round, oval, oblong and polygonal. As seen in FIG. 3, in accordance with aspects of the present technology, one or more of these die bond pads 108 may be an optional die bond pad 108a configured as explained below.

The semiconductor die 106 are formed on wafer 100 in rows and columns which are spaced apart from each other by vertical and horizontal scribe lines 112 provided between semiconductor die 106 on wafer 100. The scribe lines 112 are reserved as a border around active areas of the semiconductor die where a cut may be made to separate the semiconductor die from each other and the wafer 100.

In accordance with aspects of the present technology shown for example in FIG. 3, the optional die bond pad 108a may be electrically coupled to another (main) die bond pad 108b by metal interconnect 110. FIG. 3 shows the metal interconnect 110 in dashed lines as the metal interconnect 110 may be buried beneath a passivation layer formed on an upper surface of the wafer 100. FIG. 3 further shows electrical traces 114 extending from the die bond pads 108. These electrical traces may be connected to the integrated circuits other components within the semiconductor die 106 (only portions of these traces 114 are shown).

The metal interconnect 110 may be formed at the wafer level in any of a variety of processes. In one embodiment, the metal interconnect 110 may be formed when the metal interconnect layers and vias are deposed within the wafer, before the bond pads 108 are formed. In such an embodiment, the metal interconnect would be formed at a level of the semiconductor die 106 further from the major surface 102 than the die bond pads 108.

In a further embodiment, the metal interconnect 110 may be defined in the same process in which the die bond pads 108 and traces 114 are formed. In particular, a layer of aluminum may be laid down on the wafer 100, for example by thin film deposition, and thereafter, the layer of aluminum may be etched into a defined pattern using for example various photolithographic processes. This pattern may include the die bond pads 108, the metal interconnects 110 and the electrical traces 114. In this embodiment, the metal interconnects 110 would be at the same level as the die bond pads 108.

In another embodiment, the metal interconnect 110 may be formed as a RDL (redistribution layer) trace between the main die pad 108b and the optional die pad 108a after the bond pads 108 are formed. The redistribution layer may be formed by depositing the passivation layer on the surface of the wafer, and etching the passivation layer to expose the die bond pads 108. Thereafter, the metal interconnect 110 may be photolithograhically formed or printed on top of the passivation layer, between the main die bond pad 108b and the optional die bond pad 108a. In embodiments, a further passivation layer may be formed on top of the metal interconnects 110. In this embodiment, the metal interconnects 110 would be at a higher level (closer to surface 102) than the die bond pads 108.

In accordance with a further aspect of the present technology, the optional die bond pad 108a may be formed with first and second conductive portions which are electrically isolated from each other. The function of these first and second conductive portions is explained below, but the first and second conductive portions may be defined in optional bond pad 108a when the bond pads 108 are formed in step 206. In particular, when the layer of aluminum is deposited on the wafer and etched into a pattern of die bond pads and traces, the pads 108a may be patterned to include the two electrically isolated portions.

The positions of the die bond pads which are to form the optional and main die bond pads 108a, 108b when the finished semiconductor die are assembled into a semiconductor package are known at the wafer level, and may be part of the map used define the integrated circuits and metal layers within wafer 100. FIG. 1 shows the main die bond pad and optional die bond pad at the same positions on each semiconductor die in the wafer. It is conceivable that the main and optional die bond pads (connected by the metal interconnect 110) may be provided at different die bond pairs on different semiconductor die 106 on the wafer 100 in further embodiments.

While the figures show a single pair of main and optional die bond pads on each semiconductor die, one or more of the semiconductor die may include none or more than one main and optional die bond pad pairs. It is further understood that the particular pairs of die bond pads forming the main and optional die bond pads shown in the figures is by way of example only, and other pairs of die bond pads may be the main and optional die bond pads in further embodiments.

After the metal pads and interconnects are formed in wafer 100 in step 206, wafer 100 may be flipped over and supported on a chuck to thin the wafer 100 by grinding the inactive surface of the wafer in a step 210. Thereafter, the wafer may be diced in a step 212. The wafer be diced by a variety of cutting means including by saw blade. In further embodiments, the wafer may be diced using a stealth dice before grinding step. In such embodiments, wafer 100 may be diced in step 212 before the back grind step 210.

Figure 4:
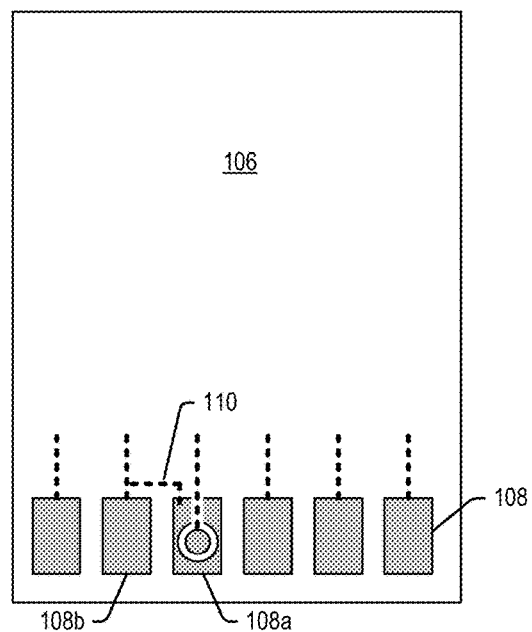
FIG. 4 is a top view of a semiconductor die according to an embodiment of the present technology.

FIG. 4 shows a top view of a semiconductor die 106 after separation from wafer 100. The die 106 includes die bond pads 108 having the optional die bond pad 108a connected to a main die bond pad 108b by metal interconnect 110. The semiconductor die 106 may for example be memory die such a NAND flash memory die, but other types of die 106 may be used. These other types of semiconductor die include but are not limited to controller die such as an ASIC, or RAM such as an SDRAM.

Figure 5:
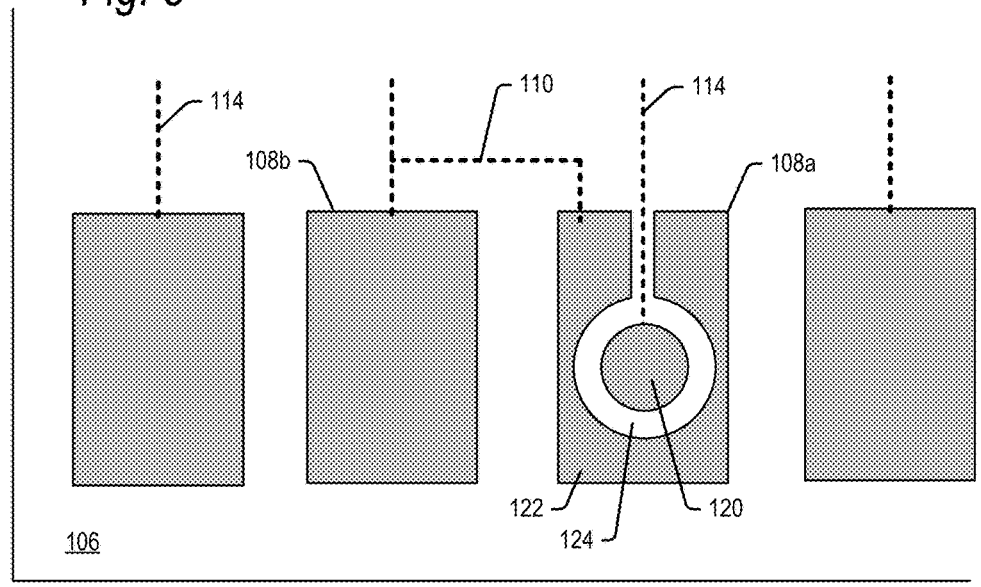
FIG. 5 is an enlarged top view of a portion of the semiconductor die shown in FIG. 4.
Figure 6:
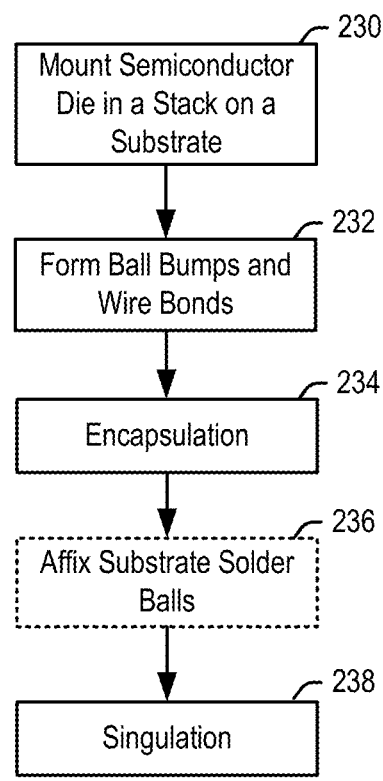
FIG. 6 is a flowchart for forming a semiconductor device according to embodiments of the present technology

FIG. 5 is an enlarged view showing additional detail of the optional die bond pad 108a. The pad 108a includes a first, interior portion 120 electrically coupled to the trace 114 extending from pad 108a. The pad 108 a further includes a second, exterior portion 122 around the interior portion 120. The exterior portion 122 is electrically isolated from the interior portion 120 by a gap 124 surrounding the interior portion 120. While shown as circular, the interior and/or exterior portions 120, 124 may be a variety of other shapes, including square, rectangular, oval, oblong and polygonal. The exterior portion 122 is electrically coupled to a common voltage state with the main die bond pad 108b by metal interconnect 110.

The figures show the optional die bond pad 108a being directly adjacent (next to) the main die bond pad 108b. However, in further embodiments, the optional die bond pad 108a may be separated from the main die bond pad 108b by one or more other die bond pads 108. In such embodiments, the optional and main die bond pads 108a, 108b would still be connected to each other by metal interconnect 110.

Individual semiconductor die 106 may be packaged together to form a semiconductor device 130 as will now be explained with reference to the flowchart of FIG. 6 and the illustrations of FIGS. 7-12. In a step 230, a number of semiconductor die 106 may be stacked on a substrate 140 as shown in the perspective view of FIG. 7. The semiconductor die 106 may be stacked atop each other in an offset stepped configuration to form a die stack 152. Embodiments may include different numbers of semiconductor die 106 in die stack 152, including for example 1, 2, 4, 8, 16, 32 or 64 die. There may be other numbers of die in stack 152 further embodiments. The die may be affixed to the substrate and/or each other using a DAF (die attach film) layer on a bottom surface of each die 106.

Although not shown, one or more passive components may additionally be affixed to the substrate 140. The one or more passive components may include for example one or more capacitors, resistors and/or inductors, though other components are contemplated.

Figure 7:
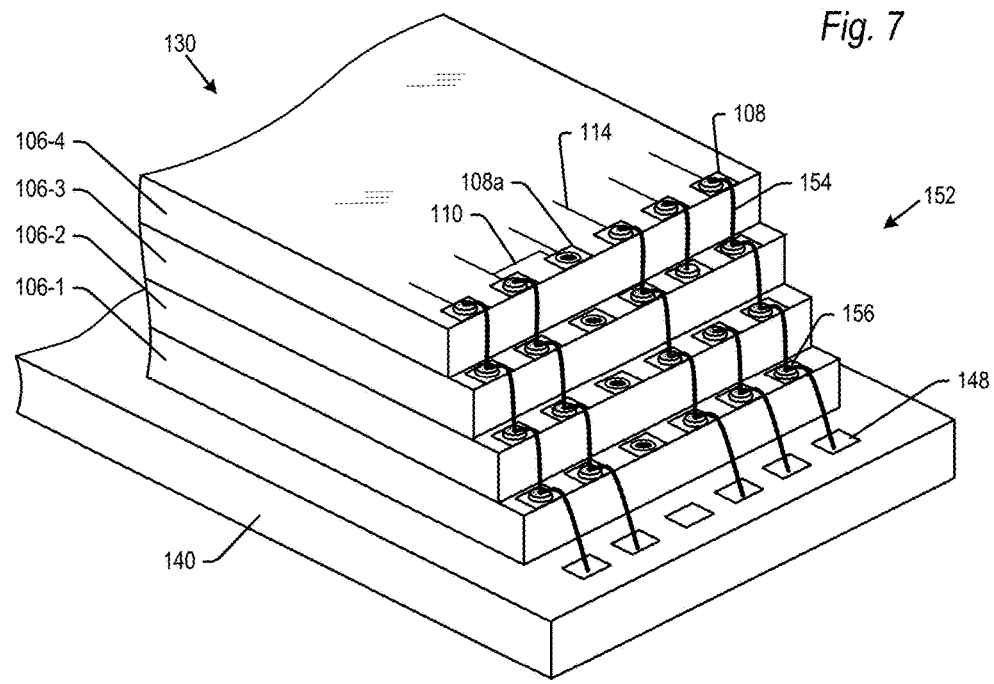
FIG. 7 is a perspective view of a semiconductor device including stacked semiconductor die having an unconnected optional die bond pad according to embodiments of the present technology.

The electrical interconnections between semiconductor die 106 and substrate 140 may be formed in step 232. As shown in FIG. 7, semiconductor die 106 are electrically coupled to each other and the substrate 140 via wire bonds 154 (one of which is numbered in FIG. 7) affixed to the die bond pads 108 on each die 106 in stack 152. Wire bonds 154 may be formed according to a number of schemes. However, in one embodiment, a wire bond capillary (not shown) forms a ball bump 156 on a first die bond pad 108 of a first die 106-1. From there, the wire bond capillary pays out wire and forms a stitch bond on a contact pad 148 of substrate 140. The wire bond capillary then breaks the wire, moves up to the first die bond pad 108 of a second die 106-2, and forms a ball bump 156. From there, the wire bond capillary pays out wire and forms a stitch bond on top of the ball bump 156 on the first die bond pad of die 106-1.

This process continues up the die stack until the first die bond pads 108 on die 106-1, 106-2, 106-3, 106-4, etc. are wire bonded to each other and substrate 140. This process is then repeated for each of the other die bond pads across the die 106 in the semiconductor device 130 (except the optional die bond pads 108a as explained below). As noted, wire bonds 154 may be formed by other methods in further embodiments. The wire bonds 154 and the ball bump 156 may be formed of gold, but may be formed of other materials in further embodiments.

As noted above, the present technology allows for redundant electrical connections to a pair of die bond pads 108a and 108b. This redundancy is accomplished without wire bonds to or from the optional die bond pad 108a of the redundant pair of bond pads. As shown for example in FIG. 7, wire bonds are not formed to or from optional die bond pads 108a. While FIG. 7 shows an entire column of optional die bond pads 108a (none of which having wire bonds), it is understood that optional die bond pads 108a may take up less than an entire column of die bond pads. Additionally, optional die bond pads 108a may be in different columns on different die in further embodiments.

Figure 8:
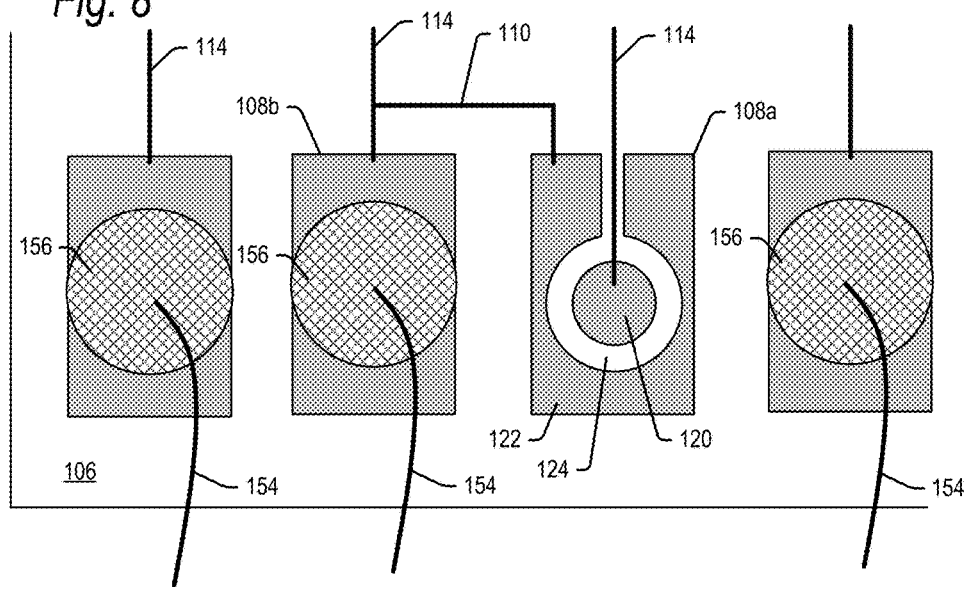
FIG. 8 is an enlarged top view of a portion of the semiconductor die shown in FIG. 7.

In embodiments, the present technology provides the option of making the die bond pads functionally redundant or not redundant. In the embodiment of FIGS. 7 and 8, the optional die bond pads 108a are unused (not redundant). That is, given the electrical isolation of the interior portions 120 and exterior portions 122 from each other on pad 108a, signals to or from the main die bond pad 108b are not shared by the optional die bond pad 108a.

In accordance with aspects of the present technology, the optional die bond pad 108a may be made redundant with the die bond pad 108b by electrically coupling the interior portion 120 of optional die bond pad 108a with the exterior portion 122. In particular, by electrically coupling the interior and exterior portions 120, 122, the optional and main die bond pads 108a, 108b may share the same voltage state by virtue of their connection through metal interconnect 110.

This may be done by depositing an electrically conductive material over both the interior and exterior portions 120, 122.

Figure 9:
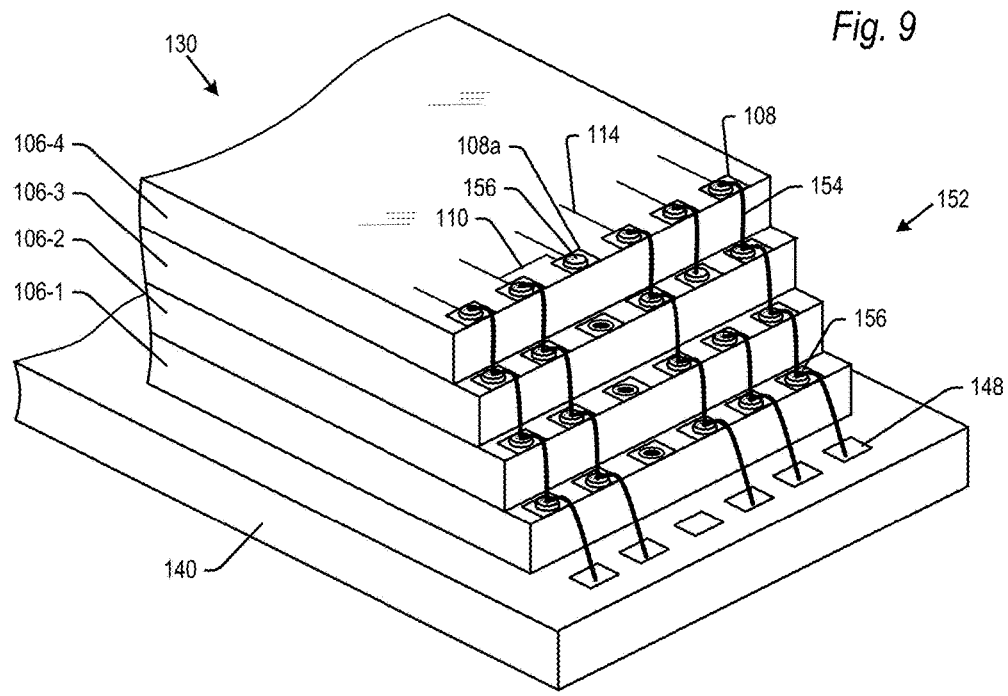
FIG. 9 is a perspective view of a semiconductor device including stacked semiconductor die having a connected optional die bond pad according to embodiments of the present technology.
Figure 10:
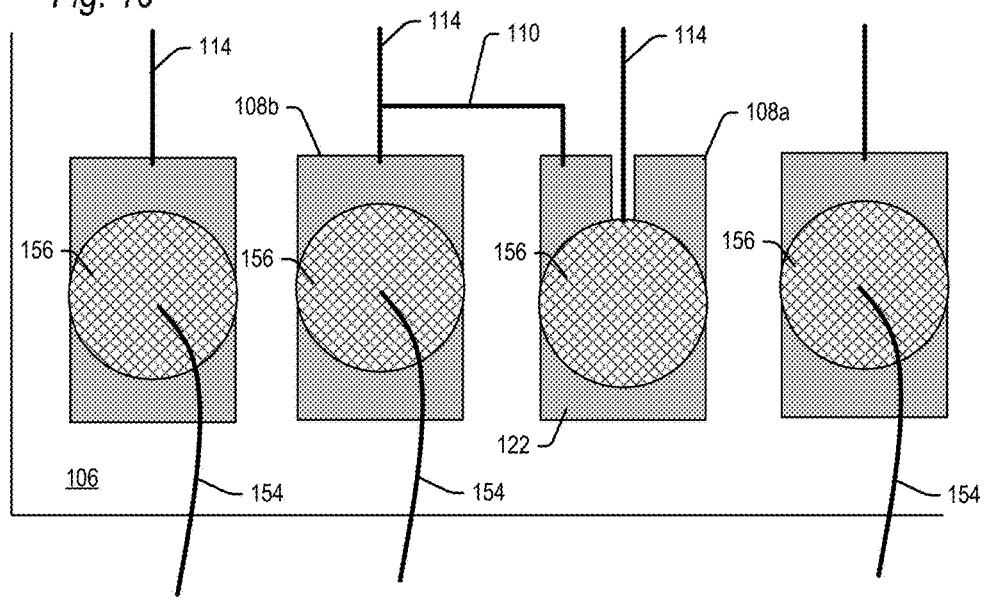
FIG. 10 is an enlarged top view of a portion of the semiconductor die shown in FIG. 9.
Figure 11:
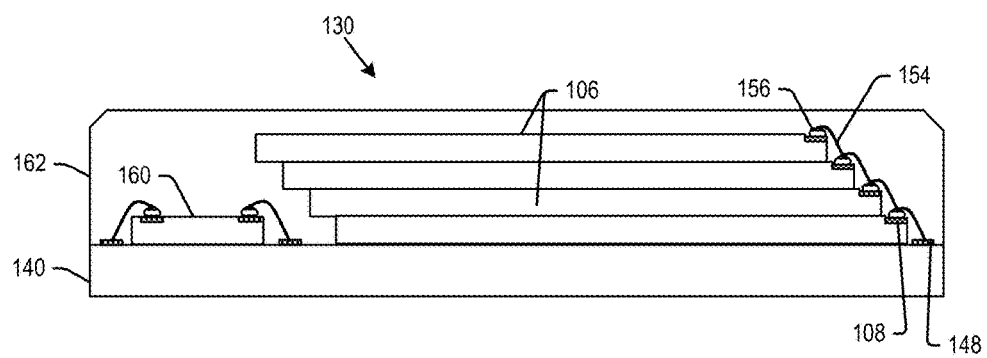
FIG. 11 is a cross-sectional side view of a finished semiconductor device according to embodiments of the present technology.
Figure 12:
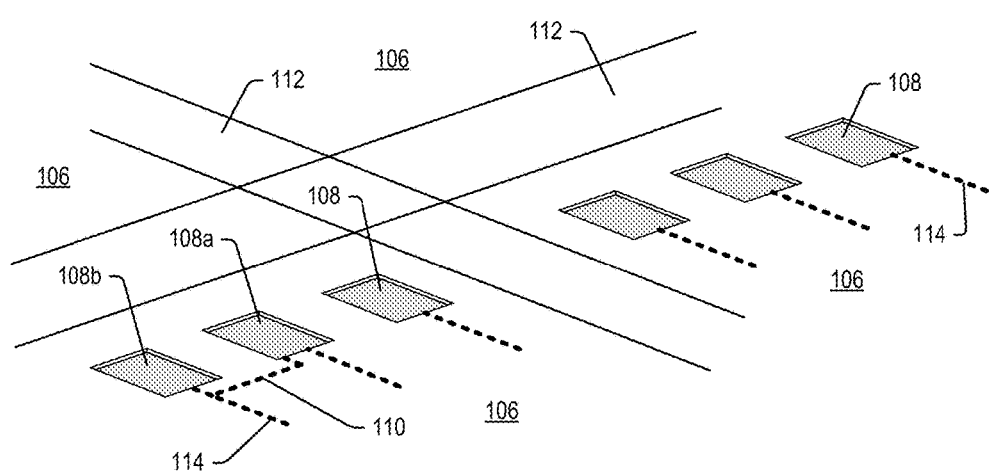
FIG. 12 is a perspective view of an alternative embodiment of the present technology.

While the interior and exterior portions 120, 122 may be electrically coupled by a variety of schemes, in one embodiment, the electrically conductive material comprises a ball bump 156 formed on the optional die bond pad 108a, as shown in FIGS. 9 and 10. The ball bump 156 covers a significant portion of the optional die bond pad 108a, and physically contacts both the interior portion 120 (covered in FIGS. 9 and 10) an exterior portion 122 pad 108a.

Using a ball bump 156 to make optional die bond pad 108a redundant has the advantage that it may be deposited during the ball bump and wire bond process described above to wire bond the other die bond pads 108 to each other and the substrate 140. In particular, when the wire bond capillary reaches an optional die bond pad 108a, the capillary may deposit a ball bump 156 on the optional die bond pad 108a, and then pull away breaking the wire and leaving just the ball bump 156. Thus, the optional die bond pad 108a may be made redundant without adding additional process steps. Whether a ball bump 156 is to be formed by the capillary on optional die bond pad 108a (so as provide redundancy) or skipped by the capillary (so as to omit redundancy) is predetermined for a given semiconductor device 130, and programmed into a controller for the wire bond capillary.

As noted, the interior and exterior portions 120, 122 of optional die bond pad 108a may be electrically coupled using electrically conductive materials other than a ball bump 156. In further embodiments, solder may be applied to the optional die bond pad 108a, either as a paste, ball or bump, to electrically couple the interior and exterior portions 120, 122. This may be done before or after the step of wire bonding the other die bond pads.

The semiconductor device 130 shown in FIGS. 7-10 may further include a controller die 160 (FIG. 11), such as an ASIC, wire bonded to the substrate 140 for controlling the semiconductor die 106. The device 130 may be encapsulated in a mold compound 162 in step 234 as shown in FIG. 10. In step 236, solder balls (not shown) may optionally be affixed to a lower surface of substrate 140. In step 238, fabrication of the semiconductor device 130 may be completed by singulating respective semiconductor devices from a panel of such devices.

Embodiments described above show the ability to make a pair of die bond pads redundant with each other. In further embodiments, more than two die bond pads may be made redundant with each other. In such embodiments, the three or more die bond pads may be electrically coupled to each other by the common metal interconnect 110, and one or more of these die bond pads may include electrically isolated portions which may be coupled together, for example with a ball bump 156, to add redundancy.

In accordance with aspects of the present technology, two or more die bond pads may be made redundant without requiring multiple wire bonds off of a single die bond pad. This improves the reliability of redundant die bond pads as compared to conventional systems which formed for example three wire bonds off of a single die bond pad. Additionally, use of a gold ball bump instead of gold wire bonds reduces the amount of gold used and can reduce fabrication costs. Additionally, the use of metal interconnects 110 and ball bumps 156 provides a sturdy and highly reliable method of providing redundant die bond pads in comparison to conventional wire bonding techniques.

In the embodiments described above, the interior and exterior portions of the optional die bond pad provide the flexibility to make the optional die bond pad 108a redundant or not. However, it is conceivable that this flexibility is not needed, and it is known at the wafer level that a pair of die bond pads will be made redundant with each other. In such embodiments, the interior and exterior portions of the optional die bond pad 108a may be omitted, and the optional die bond pad 108a may simply include a uniform surface layer of a conductor as in the other die bond pads 108. Such an embodiment is shown for example in FIG. 12. In this embodiment, the optional die bond pad 108a is connected to the main die bond pad 108b with metal interconnect 110 as described above.

In summary, the present technology relates to a semiconductor die, comprising: a plurality a die bond pads, comprising: a first die bond pad, and a second die bond pad configured to provide functional redundancy to the first die bond pad; and a metal interconnect having a first end connected to the first die bond pad and a second end, opposite the first end, connected to at least a portion of the second die bond pad.

In a further example, the present technology relates to a semiconductor die, comprising: a first major surface; a second major surface opposed to the first major surface; integrated circuits formed adjacent the first major surface; a plurality a die bond pads, the plurality of die bond pads comprising: a first die bond pad electrically coupled to a first integrated circuit, and a second die bond pad configured to optionally perform as a redundant die bond pad to the first die bond pad, the second die bond pad comprising: a first portion electrically coupled to the first die bond pad, and a second portion electrically isolated from the first portion.

In another example, the present technology relates to a semiconductor device, comprising: a substrate; a plurality of stacked semiconductor die mounted to the substrate, a semiconductor die of the stacked semiconductor die comprising: a first die bond pad, a second die bond pad configured to optionally perform as a redundant die bond pad to the first die bond pad, and an electrically conductive material, wherein the second die bond pad is configured to perform as the redundant die bond pad to the first die bond pad upon the electrically conductive material being applied over a surface of the second die bond pad.

In a further example, the present technology relates to a method of fabricating a semiconductor device with a pair of die bond pads on a semiconductor die that are optionally redundant to each other, comprising the steps of: (a) forming a first die bond pad of the pair of die bond pads on the semiconductor die; (b) forming a second die bond pad of the pair of die bond pads with electrically isolated first and second portions on the semiconductor die; and (c) electrically coupling the first die bond pad with the first portion of the second die bond pad.

In another example, the present technology relates to a semiconductor die formed from a semiconductor wafer, the semiconductor die comprising: a first major surface; a second major surface opposed to the first major surface; integrated circuits formed adjacent the first major surface; a first pad means for receiving a first ball bump, and a second pad means for optionally performing as a redundant die bond pad to the first pad means.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor die, comprising:
   a plurality a die bond pads, comprising:
   a first die bond pad, and
   a second die bond pad configured to provide functional redundancy to the first die bond pad; and
   a metal interconnect having a first end connected to the first die bond pad and a second end, opposite the first end, connected to at least a portion of the second die bond pad.

2. The semiconductor die of claim 1, wherein the second die bond pad comprises a first portion, and a second portion electrically isolated from the first portion.

3. The semiconductor die of claim 2, wherein the first die bond pad is electrically coupled to the first portion of the second die bond pad.

4. The semiconductor die of claim 1, wherein the second die bond pad has a single uniform surface layer.

5. The semiconductor die of claim 1, wherein the first and second die bond pads are adjacent to each other along an edge of the semiconductor die.

6. A semiconductor die, comprising:
   a first major surface;
   a second major surface opposed to the first major surface;
   integrated circuits formed adjacent the first major surface;
   a plurality a die bond pads, the plurality of die bond pads comprising:
   a first die bond pad electrically coupled to a first integrated circuit, and
   a second die bond pad configured to optionally perform as a redundant die bond pad to the first die bond pad, the second die bond pad comprising:
   a first portion electrically coupled to the first die bond pad, and
   a second portion electrically isolated from the first portion, the second portion having a circular footprint and having an electrical lead extending therefrom, the first portion surrounding the second portion, with the exception that the first portion is electrically isolated from the electrical lead extending from the second portion.

7. The semiconductor die of claim 6, wherein the second die bond pad performs as a redundant die bond pad to the first die bond pad upon electrically connecting the first and second portions of the second die bond pad.

8. The semiconductor die of claim 6, wherein the second die bond pad does not perform as a redundant die bond pad to the first die bond pad where the first and second portions of the second die bond pad remain electrically isolated from each other.

9. The semiconductor die of claim 6, further comprising a metal interconnect extending between the first die bond pad and the first portion of the second die bond pad for electrically coupling the first die bond pad to the first portion of the second die bond pad.

10. The semiconductor die of claim 9, wherein the metal interconnect is formed of the same material and at a same level relative to the first major surface of the semiconductor die as the first and second die bond pads.

11. The semiconductor die of claim 9, wherein the metal interconnect is formed at a level that is further away from the first major surface of the semiconductor die than the first and second die bond pads.

12. The semiconductor die of claim 9, wherein the metal interconnect is formed from a redistribution layer.

13. The semiconductor die of claim 6, wherein the semiconductor die is a NAND flash memory semiconductor die.

14. A semiconductor device, comprising:
    a substrate;
    a plurality of stacked semiconductor die mounted to the substrate, a semiconductor die of the stacked semiconductor die comprising:
    a first die bond pad,
    a second die bond pad configured to optionally perform as a redundant die bond pad to the first die bond pad, and
    an electrically conductive material, wherein the second die bond pad is configured to perform as the redundant die bond pad to the first die bond pad upon the electrically conductive material being applied over a surface of the second die bond pad.

15. The semiconductor device of claim 14, the second die bond pad comprising:
    a first portion electrically coupled to the first die bond pad, and
    a second portion separated from the first portion by a gap.

16. The semiconductor device of claim 15, wherein the second die bond pad is configured to perform as the redundant die bond pad to the first die bond pad upon the electrically conductive material being applied over the first and second portions of the second die bond pad.

17. The semiconductor device of claim 14, wherein the electrically conductive material is a ball bump deposited on the second die bond pad.

18. The semiconductor device of claim 14, wherein the electrically conductive material is one of solder paste, a solder ball and a solder bump.

19. The semiconductor device of claim 14, further comprising a plurality of wire bonds and ball bumps electrically interconnecting the plurality of semiconductor die and the substrate, the electrically conductive material comprising a ball bump of the plurality of ball bumps.

20. A method of fabricating a semiconductor device with a pair of die bond pads on a semiconductor die that are optionally redundant to each other, comprising the steps of:
    (a) forming a first die bond pad of the pair of die bond pads on the semiconductor die;
    (b) forming a second die bond pad of the pair of die bond pads with electrically isolated first and second portions on the semiconductor die; and
    (c) electrically coupling the first die bond pad with the first portion of the second die bond pad.

21. The method of claim 20, further comprising the step of making the second die bond pad redundant to the first die bond pad by depositing an electrically conductive material over the first and second portions of the second die bond pad.

22. The method of claim 20, further comprising the step of forming wire bonds and ball bumps on die bond pads of the semiconductor die to electrically connect the semiconductor die within the semiconductor device.

23. The method of claim 22, wherein said step of forming wire bonds and ball bumps comprises the step of making the second die bond pad redundant to the first die bond pad by depositing a ball bump over the first and second portions of the second die bond pad.

24. The method of claim 20, wherein said step of electrically coupling the first die bond pad with the first portion of the second die bond pad comprises the step of forming a metal interconnect between the first die bond pad and the first portion of the second die bond pad.

25. The method of claim 24, wherein said step of forming the metal interconnect comprises the step of forming the metal interconnect in the same process in which the first and second die bond pads are formed.

26. The method of claim 24, wherein said step of forming the metal interconnect comprises the step of forming the metal interconnect before the first and second die bond pads are formed.

27. The method of claim 24, wherein said step of forming the metal interconnect comprises the step of forming the metal interconnect as a redistribution layer.

28. A semiconductor die formed from a semiconductor wafer, the semiconductor die comprising:
    a first major surface;
    a second major surface opposed to the first major surface;
    integrated circuits formed adjacent the first major surface;
    a first pad means for receiving a first ball bump, and
    a second pad means for optionally performing as a redundant die bond pad to the first pad means.

29. The semiconductor die of claim 28, further comprising a metal interconnect for electrically interconnecting the first pad means with a portion of the second pad means.

* * * * *